US010772238B1

(12) United States Patent
Ross (10) Patent No.: US 10,772,238 B1
(45) Date of Patent: Sep. 8, 2020

(54) ADAPTABLE CONTAINER MOUNTED COOLING SOLUTION (71) Applicant: Amazon Technologies, Inc., Seattle, WA (US)

(72) Inventor: Peter George Ross, Olympia, WA (US)

(73) Assignee: Amazon Technologies, Inc., Seattle, WA (US)

( * ) Notice: Subject to any disclaimer, the term of this patent is extended or adjusted under 35 U.S.C. 154(b) by 175 days.

(21) Appl. No.: 15/874,845

(22) Filed: Jan. 18, 2018

Related U.S. Application Data (63) Continuation of application No. 14/447,540, filed on Jul. 30, 2014, now abandoned.

(51) Int. Cl.
*H05K 7/20* (2006.01)
*F28C 3/08* (2006.01)
*F28D 1/02* (2006.01)

(52) U.S. Cl.
CPC .......... *H05K 7/20718* (2013.01); *F28C 3/08* (2013.01); *F28D 1/02* (2013.01); *H05K 7/208* (2013.01); *H05K 7/2079* (2013.01); *H05K 7/20745* (2013.01); *H05K 7/20827* (2013.01); *H05K 7/20836* (2013.01)

(58) Field of Classification Search
CPC .......... H05K 7/20718; H05K 7/20827; H05K 7/2079; H05K 7/20745; H05K 7/208; F28C 3/08
See application file for complete search history.

(56) References Cited

U.S. PATENT DOCUMENTS

| 3,013,403 | A | 12/1961 | Grant et al. |
| 4,495,545 | A | 1/1985 | Dufresne et al. |
| 6,131,647 | A | 10/2000 | Suzuki et al. |
| (Continued) | | | |

FOREIGN PATENT DOCUMENTS

| CN | 102405452 | 4/2012 |
| CN | 102906358 | 1/2013 |
| (Continued) | | |

OTHER PUBLICATIONS

"Data Center Liquid Cooling," http://www.42u.com/cooling/liquid-cooling.htm (downloaded Jun. 17, 2014).

(Continued)

*Primary Examiner* — Ana M Vazquez
(74) *Attorney, Agent, or Firm* — Klarquist Sparkman, LLP (57) ABSTRACT

A cooling apparatus for a container-based data center includes an air handling housing, at least one movable louver, a filter and a fan. The housing is configured for suspending from a ceiling of the container and comprises at least one heat exchanger. The louver is movable to direct air flow along different paths within the housing according to a selected operating mode. The fan is positioned in the housing and controllable according to the selected operating mode. The heat exchanger is configured in a self-contained water chilling circuit positioned within the container for use in a closed loop mode. The apparatus is convertible for use in an economizer mode that draws outside air into the container. An optional auxiliary heat exchanger element has a cold side heat exchange portion positioned outside the container and a connection through the ceiling to a hot side heat exchange portion positioned within the housing.

17 Claims, 6 Drawing Sheets (56) References Cited

U.S. PATENT DOCUMENTS

| | | |
|---|---|---|
| 6,462,944 B1 | 10/2002 | Lin |
| 6,896,612 B1 | 5/2005 | Novotny |
| 8,151,578 B1 | 4/2012 | Morales et al. |
| 2010/0154448 A1 | 6/2010 | Hay |
| 2010/0263830 A1 | 10/2010 | Noteboom et al. |
| 2011/0043824 A1 | 4/2011 | Rogers |
| 2011/0239683 A1 | 10/2011 | Czamara et al. |
| 2013/0105107 A1 | 5/2013 | Chen et al. |
| 2013/0201618 A1 | 8/2013 | Czamara et al. |
| 2013/0213604 A1 | 8/2013 | Yang |
| 2015/0049431 A1 | 2/2015 | Kondo et al. |

FOREIGN PATENT DOCUMENTS

| | | |
|---|---|---|
| CN | 103135666 | 6/2013 |
| CN | 103857262 | 6/2014 |
| EP | 2821720 | 7/2015 |
| JP | 2010-065912 | 3/2010 |
| JP | 2012-524938 | 10/2012 |
| JP | 2014-509726 | 4/2014 |
| WO | WO2010/123660 | 10/2010 |
| WO | WO2012/118553 | 9/2012 |
| WO | WO2013/145246 | 10/2013 |

OTHER PUBLICATIONS

International Preliminary Report on Patentability for PCT/US2015/042626 (dated Feb. 9, 2017).
International Search Report and Written Opinion for PCT/US2015/042626 (dated Oct. 8, 2015).
"A Look at Ceiling-mounted and Floor-mounted AC Units," http://computer-room-equipment.wisdek.org/a-look-at-ceiling-mounted-and-floor-mounted-ac-units (downloaded Jun. 18, 2014).
Office Action for Japanese Patent Application No. 2017-501311 (dated Sep. 19, 2017).

ADAPTABLE CONTAINER MOUNTED COOLING SOLUTION

CROSS-REFERENCE TO RELATED APPLICATION

This a continuation of U.S. application Ser. No. 14/447,540, filed Jul. 30, 2014, which application is incorporated by reference herein in its entirety.

BACKGROUND

Container-based data centers present difficult environmental management challenges. As the containers are intended to be movable, they have relatively fixed dimensions and cannot be expanded in size. Customers continue to demand more computing power from each container-based data center, so planned products specify only minimal spacing between servers and related equipment and the surrounding container. As a result of increasing the number, capacity and/or computing power of the servers, the heat load generated during their operation increases. This heat load must be managed to promote high performance and long life of the servers.

In addition, the cooling system for a container-based data center should be adaptable to suit a range of different requirements. For example, the cooling system should be adaptable to provide sufficient cooling in different geographical areas, as well as over different seasons and different times of day. As customer needs change, the container may be fitted with a fewer number or greater number of servers, which may affect the heat load. Other types of equipment changes or technology advances may also affect the heat load and consequently, the required cooling capacity.

DETAILED DESCRIPTION

Described below are implementations of a cooling system for a container-based data center that is adaptable to operate in different modes and has a ceiling-mounted housing configured to fit in a space above existing server racks and other equipment. Within the housing, a fan or other type of air mover draws air through a cooling unit, which generally includes a heat exchanger. In some implementations, this heat exchanger is configured to be part of a self-contained chilled water cooling circuit within the container. The cooling system can be operated in a closed loop mode using this heat exchanger to cool the air within the container. The cooling system can also be adapted between the closed loop mode and other operating modes, such as an open loop mode that draws in outside air and an auxiliary cooling mode that uses an auxiliary heat exchanger having its cold side heat exchanger portion mounted outside the container. These and other implementations are described below in greater detail.

Figure 1:
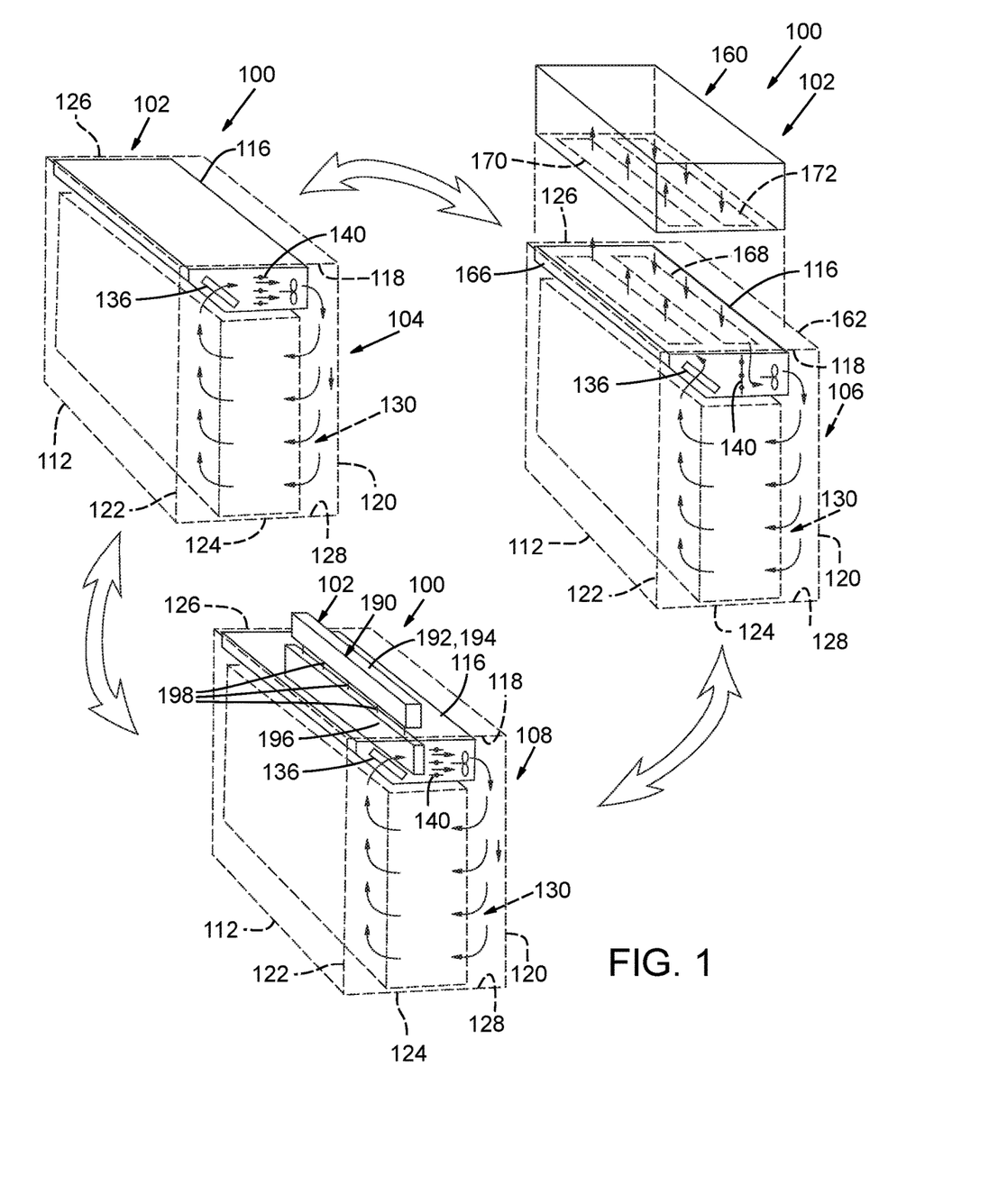
FIG. 1 is a schematic perspective view of a cooling apparatus for a container-based data center showing its ability to be adapted among at least the three illustrated operating modes.

FIG. 1 is a perspective view showing a schematic depiction of a container-based data center 100 with a multi-mode cooling system 102 adaptable to operate in at least the three illustrated modes 104, 106, 108. A representative container or container structure 112 defines a footprint and serves to house multiple server racks 114 and other equipment. As shown, the server racks 114 in this implementation are generally vertically oriented and arranged approximately along a center longitudinal axis of the container 112, although many other configurations are possible.

A housing 116 for the cooling system or apparatus 102 is configured to occupy a space above the server racks 114 and below a ceiling 118 of the container. In some implementations, the housing 116 is mounted to or suspended from the ceiling 118. In this way, the housing 116 does not consume valuable floor space or footprint, which is reserved for servers, other equipment and ensuring that personnel can gain access to and maintain servers and equipment.

In addition to its ceiling 118, the container 112 has side walls 120, 122, end walls 124, 126 and a floor 128 that together define an interior 130 as shown. In some implementations, the container 112 has dimensions consistent with a shipping container, such as, e.g., an ISO C container, although the cooling system 102 could of course be used with container-based or similar systems of different sizes.

The cooling apparatus 102 and its housing 116 will be described in more detail in connection with FIG. 1 and FIGS. 2-4, which are separate end elevation views of the data center 100 with the end wall 124 removed to show the three different operating modes. The housing 116, which is shown in solid lines in FIG. 1, generally extends along a majority of the length of the container 112. An inlet opening 132 is defined in the housing 116 at or near a first end 134 (see, e.g., FIG. 2). In the illustrated implementation, the inlet opening 132 is formed in an angled surface of the housing 116 (see also, e.g., FIGS. 5A-5C).

Within the housing, there is a cooling unit 136 for cooling air. In some implementations, the cooling unit 136 includes a heat exchanger 137 having an air "hot side" for receiving hot air drawn in through the inlet opening 132 and cooling it, and a cooling fluid "cold side" for receiving heat from the hot air and dissipating it. In some implementations, the cooling fluid is chilled water, and the heat exchanger (also referred to herein as "a chilled water cooler") is connected in series to other components of a conventional chilled water loop, including other heat exchanger(s), a pump, valves, sensors and other components. In some implementations, the chilled water system is described as a stand-alone 60-ton chilled water system. In other implementations, the heat exchanger 137 could be a refrigerant-based heat exchanger that uses R-134a or a similar refrigerant. Other types of heat exchangers can also be used.

Figure 2:
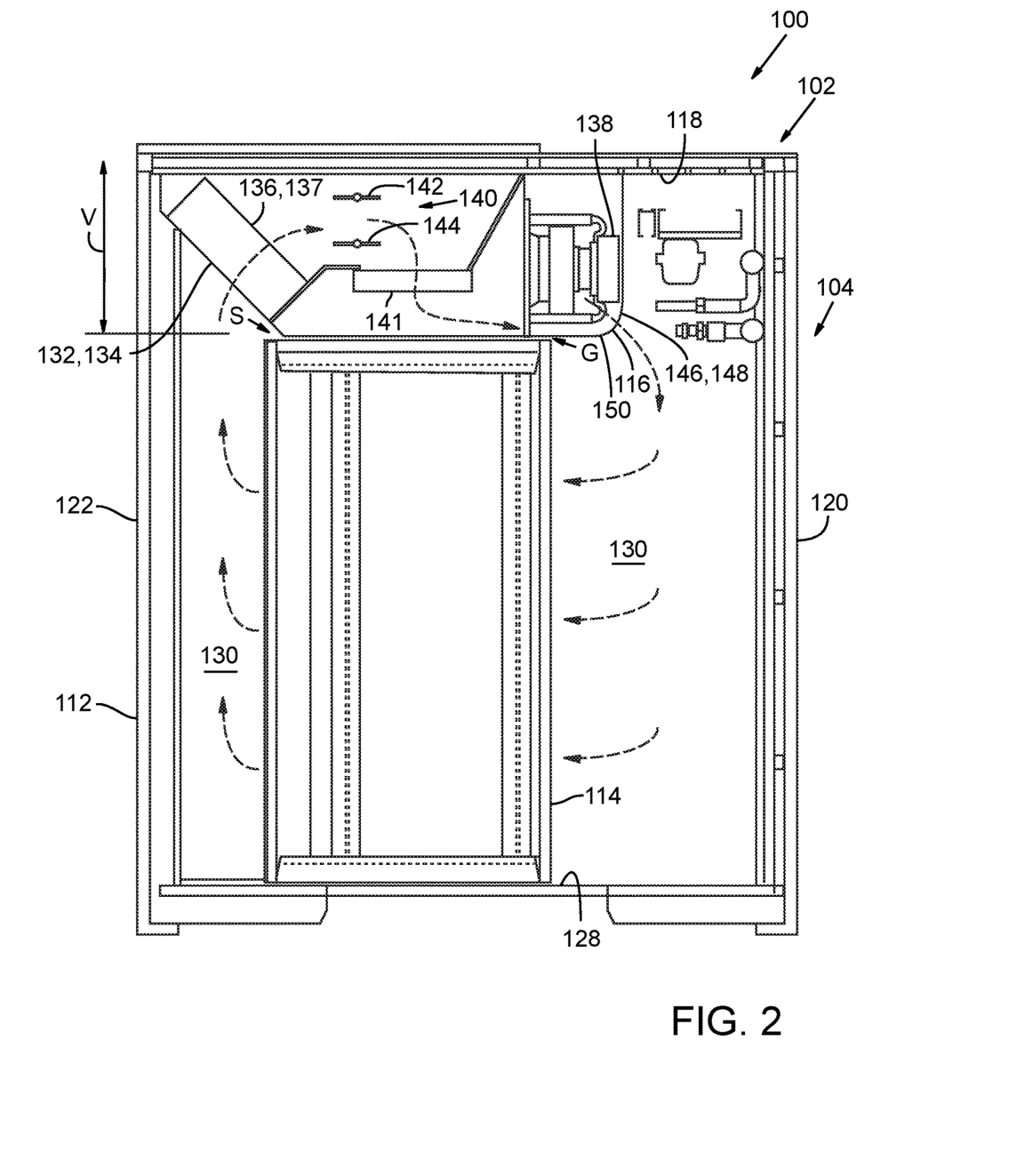
FIG. 2 is an end view of a container-based data center showing an implementation of the cooling apparatus adapted for a closed loop operating mode.
Figure 3:
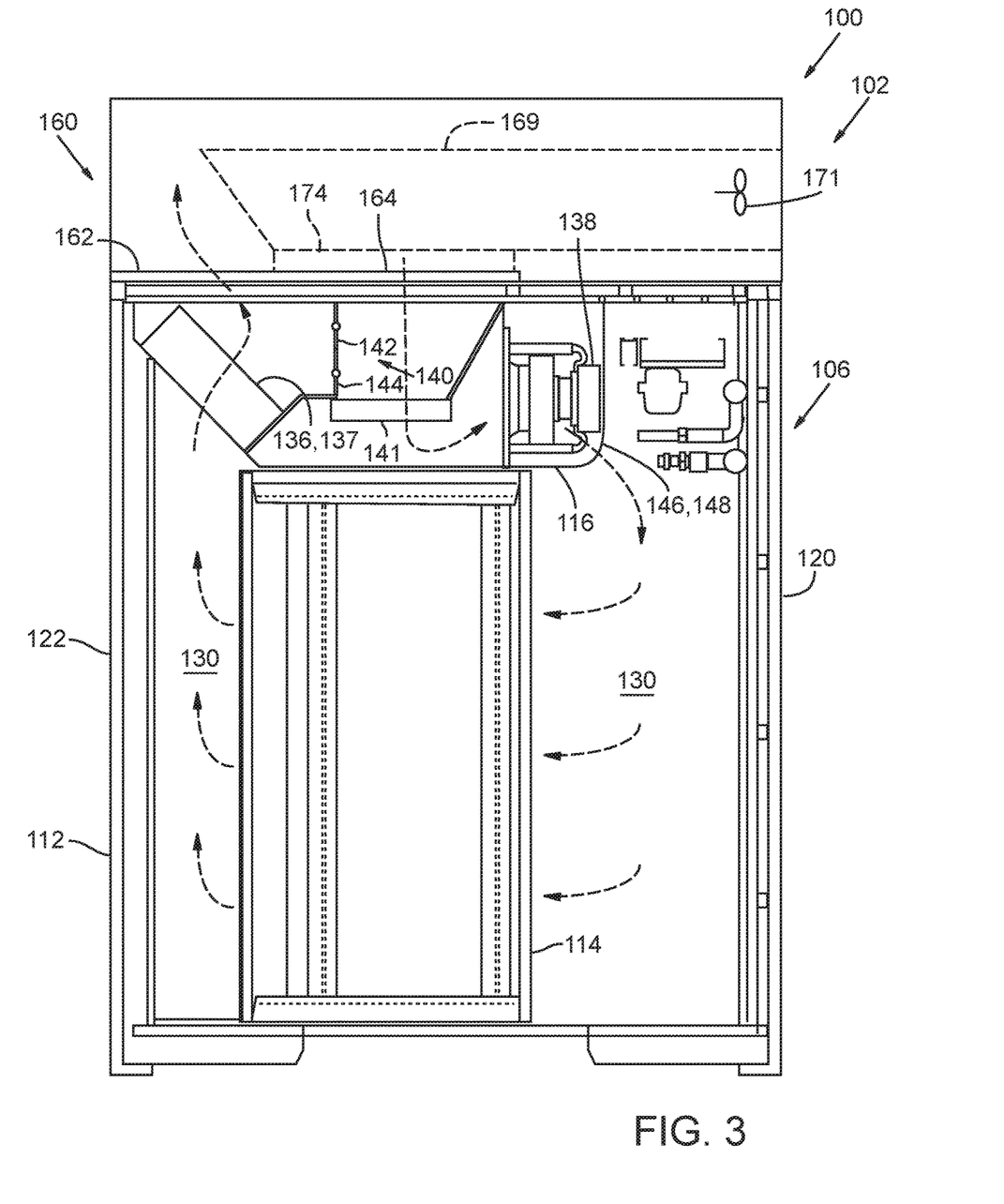
FIG. 3 is an end view of a container-based data center showing an implementation of the cooling apparatus adapted for an open loop operating mode.
Figure 4:
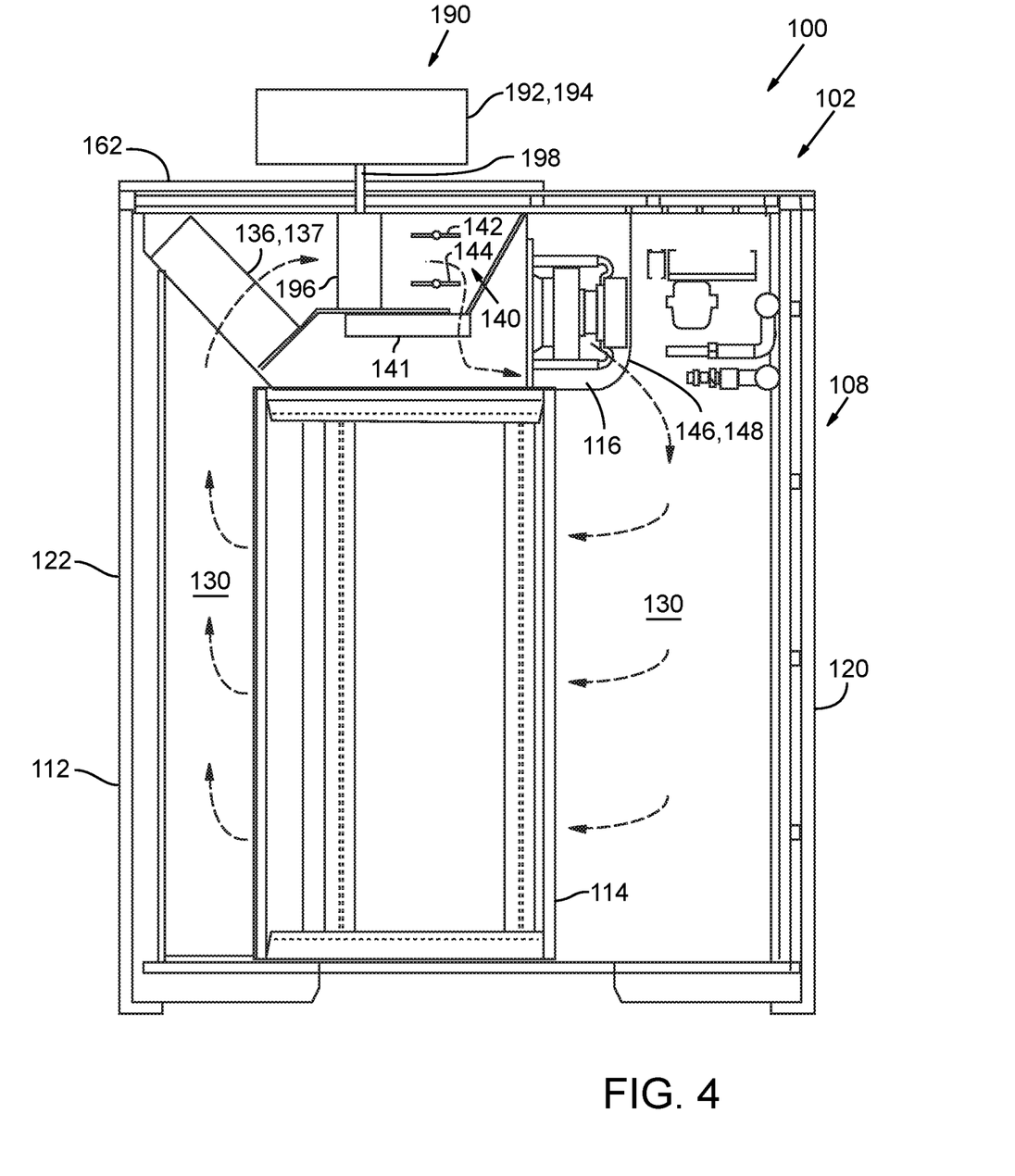
FIG. 4 is an end view of a container-based data center showing an implementation of the cooling apparatus adapted for use in an auxiliary cooling mode with an auxiliary heat exchanger.

There is a fan 138 or other type or air mover for moving air through the housing 116 and throughout the rest of the various air flow circuits as shown by the arrows. In the illustrated implementation, the fan 138 draws air into the housing 116 and conveys it out through an outlet opening 146 positioned at or near a second end 148 of the housing 116 into the interior 130 of the container 112. A louver 140 or other air directing device is positioned between the fan 138 and the outlet opening 146 on one side, and the inlet opening 132 and the cooling unit 136 on the other side, to selectively adapt the flow path according to the desired operating mode. Referring to FIGS. 2-4, the louver 140 in some implementations has blades two 142, 144, although it would be possible to use a single blade or more than two blades. For example, in FIG. 1, the louver has three blades. Further details about the flow path are described below.

Figure 5A:
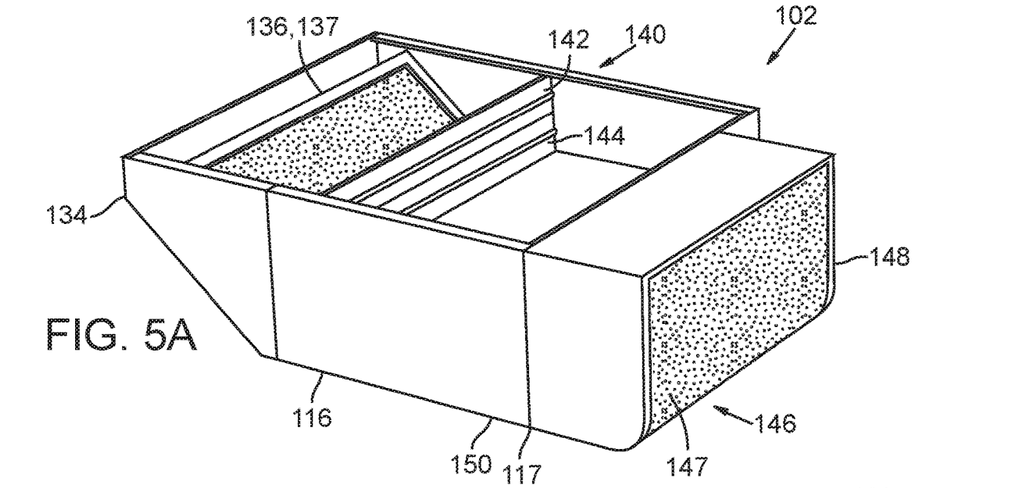
FIG. 5A is a perspective view of an embodiment of the cooling apparatus housing.

The outlet opening 146 can be designed as a specific opening, or it can includes spaces in and around the fan 138 and its mounting and enclosure. For example, as shown in FIG. 5A, there can be a grille or grate 147 positioned in the area of the outlet opening.

As best seen in FIG. 2, the multi-mode cooling apparatus 102 and housing 116 can be designed to have a vertical dimension V designed to closely fit the space between an upper surface of a tallest server rack (or other piece of equipment) and the ceiling 118 of the container. In some implementations, such as is shown in FIG. 2, a bottom surface 150 of the housing 112 is fitted very close to the server racks 114 such that only a small gap G between the two exists. The gap can be filled with a seal S to promote flow in the direction of the arrows as shown, which includes flow into and through the server racks 114, e.g., from right to left as shown in the figures without substantial air flow "short circuiting" through the gap G. The airflow in the area of the racks 114 may be supplemented by specific rack or server cooling systems (not shown).

Referring to the upper left view in FIG. 1 and FIG. 2, the multi-mode cooling apparatus is shown configured for a closed loop operating mode 104. In the closed loop operating mode, hot air from the interior 130 is drawn through the inlet opening 132 and cooling unit 136 and through the louver 140 (in an open position as shown) under the action of the fan 138. During the process, the cooling unit 136 cools the hot air, such as by heat transfer to chilled water circulating in the heat exchanger 137 of the cooling unit. The cooled air is then exhausted from the housing through the outlet opening 146 and back into the interior 130. The air flow cycle is completed by the air flowing through the server racks 114 from right to left as shown by the arrows.

Referring to the upper right view in FIG. 1 and FIG. 3, the multi-mode cooling apparatus is shown configured for an open loop cooling mode 106. In the open loop cooling mode, cooling the hot air in the interior 130 includes adding other air, e.g., air at a lower temperature. In some implementations, the air that is added is outside air, such as when outside air temperatures are favorable or other circumstances warrant using outside air.

To admit outside air, there can be at least one opening 164 (FIG. 3) formed in the housing 116 and/or roof of the container 162. In most cases, it is desirable to provide filtration, which as used herein broadly means preventing airborne matter (particles, precipitation, objects, etc.), as well as preventing other undesired objects (animals, trespassers, etc.) from entering the container through the opening 164. Therefore, one or more filtering elements (shown schematically at 174) is typically provided, in addition to simply forming the opening in the container. Conveniently, the filtering element 174 can be provided in a separate housing called an outside air module 160. The outside air module 160 is designed to be installed on the roof of the container 112. Referring to FIG. 3, the outside air module 160 can include a duct 169 or other air directing member, such as to guide air from a side opening to an opening 172 (as is described below in greater detail).

Referring to FIG. 1, in some implementations, there are first and second openings 166, 168 formed in the housing 116/roof 162 and aligned first and second openings 170, 172 formed in the outside air module 160. In this way, better circulation through the outside air module 160 can be achieved. In the illustrated implementation, the louver 140 is changed to the closed position for the open loop operating mode, which causes hot air to be drawn from the interior 130, through the cooling unit 136, through the openings 166, 170 and into the outside air module 160, through the module 160 to mix with cooler outside air, and back through the openings 172, 168 into the housing 112 and out through the outlet opening 146 as cooler air.

The cooling unit 136 can be operated normally during the open loop mode, in which case the addition of cooler outside air serves as redundant cooling to supplement the cooling it normally provides. Alternatively, the cooling unit 136 need not be operated, such that only outside air is used, e.g., when conditions permit or in an emergency (e.g., if the cooling unit 136 has failed). It would also be possible in some implementations to include a heat exchanger and/or an outside air moving device 171 in the outside air module 160.

Referring to the lower center view of FIG. 1 and FIG. 4, the multi-mode cooling apparatus is shown configured in an auxiliary cooling mode 108. In the auxiliary cooling mode, the system is configured as in the closed loop operating mode described above, but additional cooling is provided by an auxiliary cooling unit 190. In some implementations, the auxiliary cooling unit 190 has an auxiliary heat exchanger 192 with at least a cold side heat exchange portion 194 positioned outside the container 112. A hot side heat exchange portion 196 of the heat exchanger 192 is positioned within the housing. As shown schematically in FIGS. 1 and 4, connections 198 link the functions of cold side heat exchange portion 194 and the hot side heat exchange portion 196 together. Air that has been cooled by the cooling unit 136 is further cooled by the heat exchanger 192 before flowing through the louver 140 under the action of the fan and exiting out into the interior 130 as cooler air.

The auxiliary heat exchanger, which is shown schematically at 192, may be a thermal siphon (e.g., a heat pipe), a dry cooler, a chilled water cooler, a direct expansion cooler or an evaporative cooler. As is known, a direct expansion cooler/system uses a conventional refrigerant vapor expansion/compression cycle. In some implementations, the auxiliary heat exchanger 192 can be operated without operating the cooling unit 136, such as when conditions allow for it and/or if the cooling unit 136 has failed.

Figure 5B:
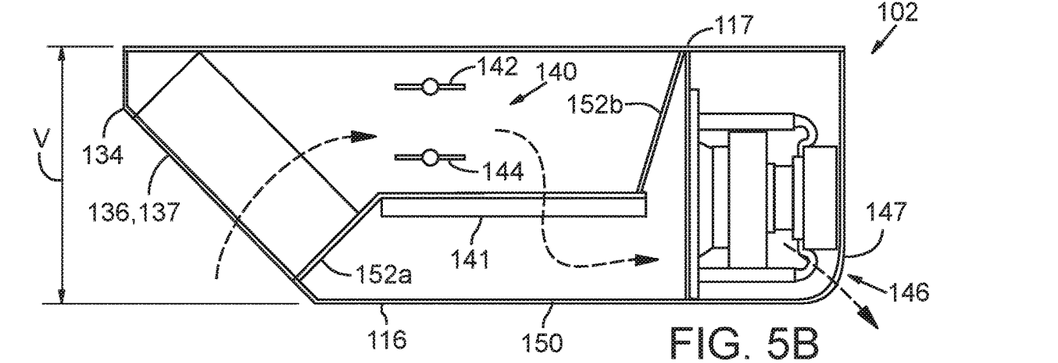
FIG. 5B is a side section view in elevation of the cooling apparatus housing of FIG. 5A, but showing the louver in an opened position and the air flow path down through a filter and laterally through the fan and out an outlet.
Figure 5C:
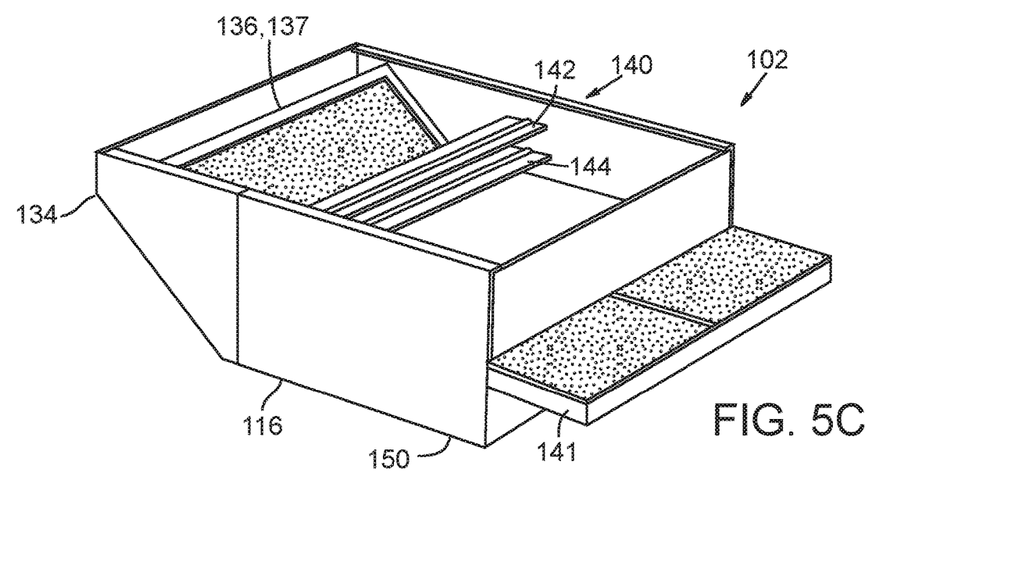
FIG. 5C is a perspective view similar to 5A, except showing the filter being removed for servicing or replacement.

FIGS. 5A, 5B and 5C are various views of the multi-mode cooling apparatus 102/housing 112 and internal components and features. The housing 116 can be made of sheet metal or another suitable material. One or more internal air directing surfaces, such as the first internal air directing surface 152a or the second internal air directing surface 152b of respective members, as shown in the sectioned elevation view of FIG. 5B, can be added to improve flow through the housing 112. In FIG. 5A, the louver 140 is shown in the closed position. In FIGS. 5B and 5C, the louver 140 is shown in the open position. As shown, the filter 141 can be positioned approximately horizontally, and the air flow path within the housing can be configured to cause flow to travel downwardly through the filter 141 before traveling laterally to the fan 138 and the outlet opening 146.

The housing 116 can have a hinged portion 117 (FIGS. 5A and 5B) covering the fan 138 that allows servicing of the fan and other components without disassembling the entire cooling apparatus 102. By orienting the filter 141 approximately horizontally, it can be removed from the housing (such as for cleaning or replacement) by moving the hinged portion out of the way (or detaching it), as is shown in FIG. 5C. In addition, required filtering capacity can be provided without requiring the vertical dimension of the housing 116 to be enlarged.

Figure 6A:
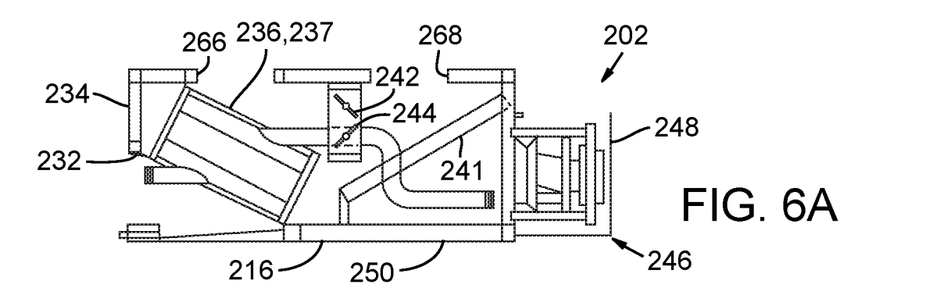
FIG. 6A is an end elevation view of a cooling apparatus according to another implementation with the housing material removed to reveal the internal components and their configuration.
Figure 6B:
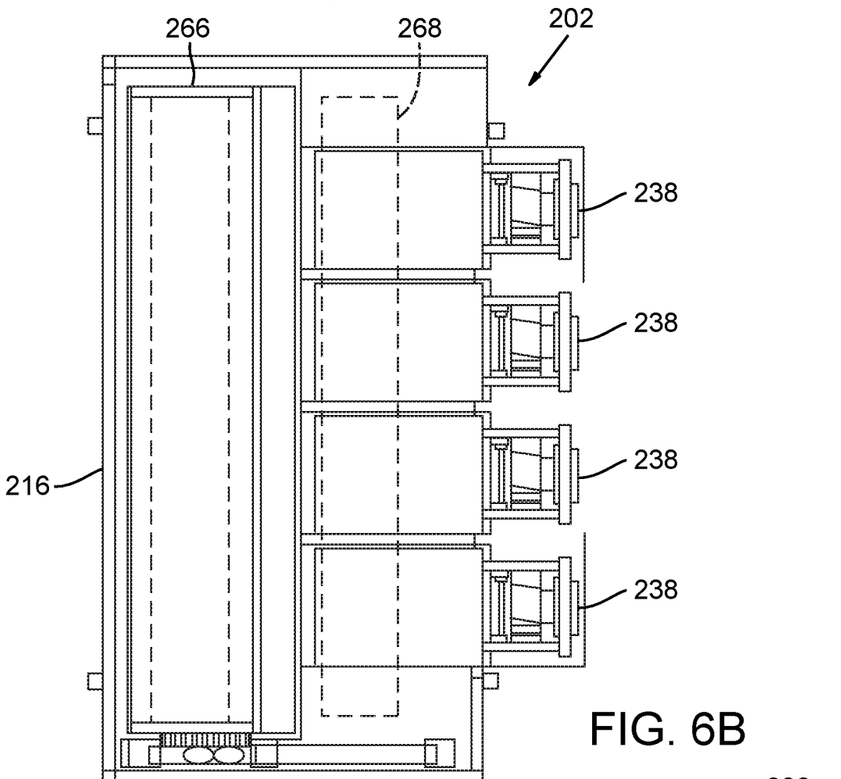
FIG. 6B is a top plan view of the cooling apparatus of FIG. 6A.
Figure 6C:
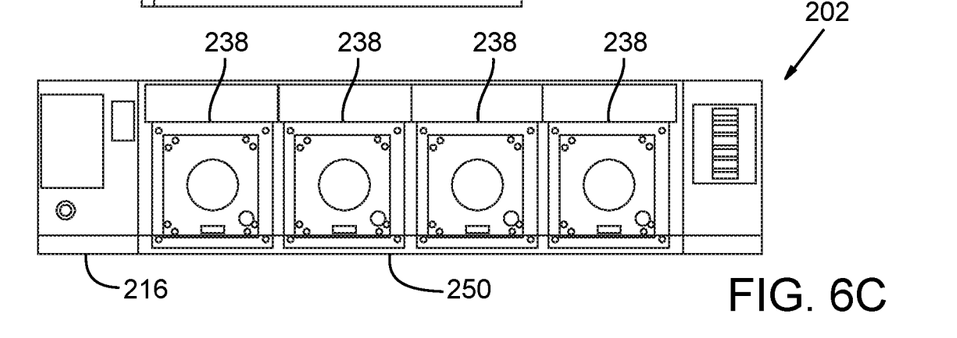
FIG. 6C is a right side elevation view of the cooling apparatus of FIGS. 6A and 6B.

FIGS. 6A, 6B and 6C are sectioned end elevation, top plan and right side elevation views, respectively, of a multi-mode cooling apparatus 202 according to another implementation. In general, reference numerals in FIGS. 6A-6C have the same numeral plus 100 as corresponding elements described above. As seen in FIG. 6A, the housing 216 can include a horizontal drip tray beneath the cooling unit 236 and aligned with the bottom surface 250. The liquid side connections for the heat exchanger 237 can be seen in FIG. 6A. As best seen in FIGS. 6B and 6C, the cooling apparatus includes four fans 238.

In general, the heat exchanger 137 of the cooling unit 136 is a chilled water cooler or a direct expansion cooler, but other cooling technologies are of course possible. In general, the heat exchanger 192 is a thermal siphon, a chilled water cooler, a direct expansion cooler or another type of refrigerant-based heat exchanger. It is also possible to implement so-called conductive cooling technologies, such as the conductive cooling system marketed by Inertech that uses "standard refrigerant" instead of water and purportedly saves greatly on energy costs.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

The disclosed methods, apparatus, and systems should not be construed as limiting in any way. Instead, the present disclosure is directed toward all novel and nonobvious features and aspects of the various disclosed embodiments, alone and in various combinations and subcombinations with one another. The disclosed methods, apparatus, and systems are not limited to any specific aspect or feature or combination thereof, nor do the disclosed embodiments require that any one or more specific advantages be present or problems be solved.

In view of the many possible embodiments to which the disclosed principles may be applied, it should be recognized that the illustrated embodiments are only preferred examples and should not be taken as limiting the scope of protection. Rather, the scope of protection is defined by the following claims. We therefore claim all that comes within the scope of these claims.

What is claimed is:

1. A multi-mode cooling apparatus configured to be mounted in a container-based data center housing multiple server racks, the data center housing comprising a shipping container having walls, a ceiling and a floor defining a bounded interior space to house the multiple server racks, wherein the multi-mode cooling apparatus is selectively adaptable to operate in multiple cooling operation modes to cool the interior space, the multi-mode cooling apparatus comprising:
   an air handling housing configured to be mounted to the ceiling of the container structure, wherein the air handling housing is further configured to extend downwardly from the ceiling for positioning closely spaced above the server racks;
   an air inlet formed at a first end of the air handling housing and in communication with an interior of the container-based data center, wherein the air inlet is downwardly angled;
   a heat exchanger located in the air handling housing downstream of the air inlet; and
   a movable air directing member located downstream of the heat exchanger, wherein the movable air directing member is positioned in a first position to allow air from the interior space to be drawn into the air handling housing for a first operation mode and in a second position restricting air from the interior space from being drawn into the air handling housing in a second operation mode, and wherein an air flow path through the air handling housing for the first operation mode comprises an upward segment through the downwardly angled air inlet and towards the movable air directing member and a downward segment from the movable air directing member in a downstream direction;
   an air moving device located in the air handling housing downstream of the movable air directing member;
   an air outlet formed at a second end of the air handling housing downstream of the air moving device and in communication with an interior of the container-based data center; and
   an auxiliary heat exchanger having at least a hot side heat exchange portion positioned within the air handling housing and a cold side heat exchange portion spaced apart from the hot side heat exchange portion for positioning external to the air handling housing.

2. The cooling apparatus of claim 1, wherein in the first operation mode, the cooling apparatus is operable to cool the air with the heat exchanger and to exhaust cooled air from the air handling housing into the interior space.

3. The cooling apparatus of claim 1, wherein in the second operation mode, the cooling apparatus is operable to draw in outside air through an outside air opening with the air moving device and exhaust the outside air from the air handling housing into the interior space.

4. The cooling apparatus of claim 1, wherein the cooling apparatus is operable in a purge mode by which the air moving device is used to draw in outside air from outside the container-based data center housing to cool the interior space.

5. The cooling apparatus of claim 1, further comprising a separate outside air module for use when the auxiliary heat exchanger is removed, the separate outside air module being positionable on an exterior of the container and in communication with the interior space via at least one opening in the ceiling, wherein the separate outside air module comprises a filtration member and at least one outside air moving device.

6. The cooling apparatus of claim 1, wherein the auxiliary heat exchanger comprises a thermal siphon, a dry cooler, a chilled water cooler, a direct expansion cooler or an evaporative cooler.

7. The cooling apparatus of claim 1, wherein the shipping container is an ISO C shipping container.

8. The cooling apparatus of claim 1, further comprising a hinged portion for providing access to the air moving device.

9. The cooling apparatus of claim 1, further comprising a seal positioned along a lower periphery of the air handling housing.

10. The cooling apparatus of claim 1, wherein the movable air directing member comprises a louver.

11. The cooling apparatus of claim 1, further comprising a filter.

12. The cooling apparatus of claim 11, wherein the filter is positioned horizontally downstream of the movable air directing member and upstream of the air moving device, and wherein the downward segment of the air flow path for the first operation mode passes through the filter.

13. The cooling apparatus of claim 1, wherein the air moving device comprises a fan.

14. The cooling apparatus of claim 13, further comprising a grille positioned at the second end of the housing and covering the fan.

15. The cooling apparatus of claim 14, wherein the grille is part of an access portion attached by a hinged connection to allow the fan to be rotated in a horizontal plane for access to the housing.

16. The cooling apparatus of claim 1, wherein the housing comprises a member configured to form a first internal air directing surface, wherein the first internal air directing surface extends internally from the downwardly angled air inlet in a direction transverse to the downwardly angled air inlet.

17. The cooling apparatus of claim 16, wherein the housing comprises a member configured to form a second internal air directing surface, wherein the second internal air directing surface is positioned downstream of the movable air directing member and upstream of the air outlet.

* * * * *